United States Patent [19]

Pitt

[11] Patent Number: 4,648,066
[45] Date of Patent: Mar. 3, 1987

[54] MEMORY MODULE

[75] Inventor: Terry L. Pitt, Rochester, N.Y.

[73] Assignee: Combustion Engineering, Inc., Windsor, Conn.

[21] Appl. No.: 585,326

[22] Filed: Mar. 1, 1984

[51] Int. Cl.⁴ ............................................ G06F 12/00
[52] U.S. Cl. ..................................................... 364/900
[58] Field of Search ... 364/200 MS File, 900 MS File, 364/140; 361/380

[56] References Cited

U.S. PATENT DOCUMENTS 4,090,247  5/1978  Martin .................................. 364/900
4,155,108  5/1979  Tuttle et al. ..................... 361/380 X Primary Examiner—Raulfe B. Zache
Attorney, Agent, or Firm—William W. Habelt

[57] ABSTRACT

A self-contained, portable memory module for transferring configuration data from one programmable panel controller to another. An internal replaceable lithium battery is provided for powering the memory integrated circuit chip when the module is not connected to a powered controller. The battery and module are interconnected by a three wire battery lead that can be plugged into the module in either direction. The module also has a hinged case with molded feet allowing the module to be stored upright on a flat surface to prevent damage to the internal lithium battery. The module further comprises a connector, recessed for protection from static electrical discharges, for interfacing the module to the controller, and a special battery connector which allows battery replacement without loss of the stored data.

6 Claims, 3 Drawing Figures

MEMORY MODULE

GENERAL DESCRIPTION AND PURPOSE OF THE INVENTION

A self contained and portable means of storing a MOD 30 instruments data base was needed. The MOD 30 data base is relatively large and a means of keeping it secure when the instrument lost power was required, since it would require a considerable effort to reprogram the instrument. A means of moving the configured data base from a failed instrument to a good instrument was also an original goal as long as the portable data base could be protected, to a degree, from instrument failures. The following summarizes the main design goals:

1. Portability of the data base.
2. Safety and reliability in preserving the stored data base.
3. Ease of customer operation in configuring multiple instruments.

DETAILED DESCRIPTION

Figure 1:
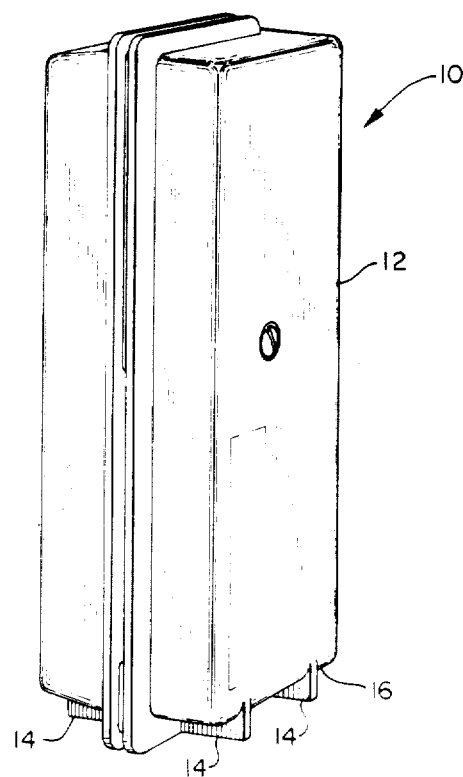
FIG. 1 is a perspective view of the outer case of a memory module designed in accordance with the present invention.

Referring to the Drawing, there is depicted therein a portable memory module 10 for a programmable instrument, designed in accordance with the present invention.

A hinged polypropylene case 12 was chosen to which feet 14 were molded into the base 16, in order to allow upright storage when not attached to an instrument. The size was kept small ($4\frac{3}{8}'' \times 2 \times 1\frac{1}{2}''$) to allow case of transfer from instrument to instrument. See FIG. 1.

Figure 2:
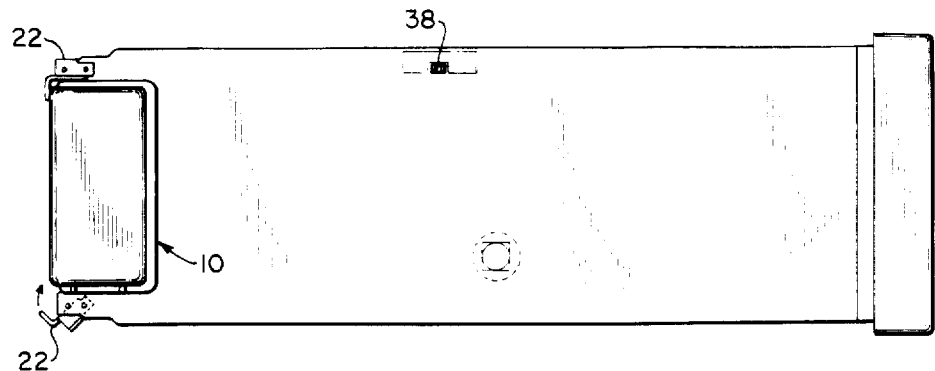
FIG. 2 is a memory module interconnected with a programmable instrument.

A long life lithium battery 18 was chosen along with low power consumption CMOS memory 20 components. Small locking arms 22 were added to the instruments to lock the module 10 in place. The locking arms 22 have to be engaged before an instrument could be inserted into its housing. This prevented the module 10 from being shaken from the instrument during instrument insertion or due to vibration in the customer's environment. See FIG. 2.

The memory module 10 was given a recessed connector 24 to protect it from being touched while being handled. This would greatly increase its resistance to static electricity.

The portability of the module 10 gave the customer the ability to move a configured data base from one instrument to another. The memory module 10 could also be carried or shipped to a customer's site from central engineering control. Each instrument also had its own dedicated memory, the module 10 was not a necessity but an option.

With the module 10, a customer could rapidly configure any number of instruments by downloading each instrument in succession from one configured module.

Another big advantage was being able to move the module 10 from a failed instrument to a good instrument. This could be done successfully only if the failure did not affect the memory module 10. This saves the customer from going back to written records of the original configuration and having to reconfigure the complete data base. Often original records are so outdated that they are of little use.

The memory module 10 also holds the most recent intermediate and most recent final output calculations for the instruments algorithms. In case of plant power interruptions, the instrument can power up in the same conditions it was in when power failed.

Figure 3:
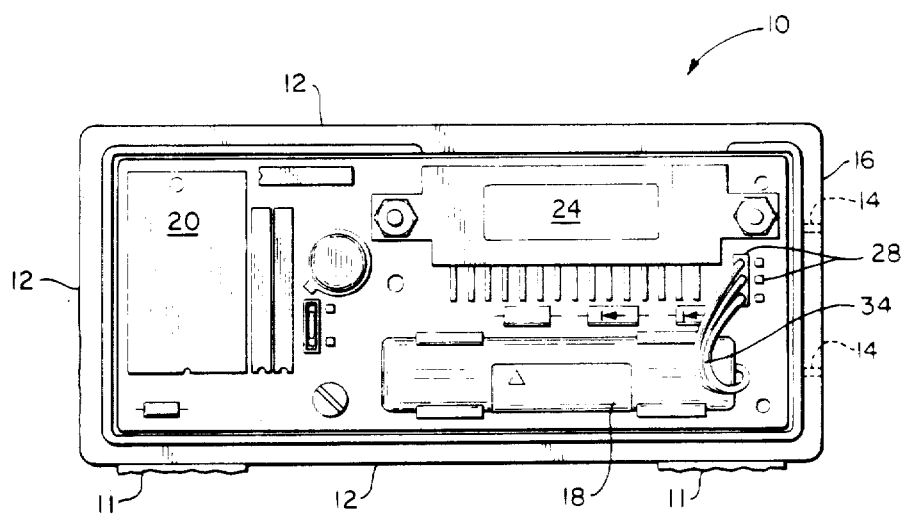
FIG. 3 is a top view of a memory module with one side of the outer case removed.

A dual battery connector 28 was added to allow attachment of a second battery 32 before removal of the first battery 30. This keeps the modules data base intact while installing a fresh battery. See FIG. 3. A special 3-wire battery lead configuration 34 is used to allow the battery connector 28 to be able to be plugged into the memory module 10 in either direction. A battery check circuit 36 on the instrument places the memory modules battery 32 under simulated load periodically to check the condition thereon.

In order to provide increased security of data within the memory module 10, the software must perform certain operations before the write to the module can be completed. These "interlocks" involve a specific software manipulation of the hardware circuits which will enable writing onto the modules specific address for a specified period of time. These hardware and software interlocks were used to increase the modules resistance to damage due to instrument failure.

A set of diagnostics is also performed on the memory module 10 each time power is applied to the instrument and also whenever the instrument is being reconfigured. First the configuration of module 10 is checked to see that it is the right type of configuration for that instrument type. All of the modules are the same until they become configured for a particular type of instrument, then they will only work on that instrument type. The memory module 10 is also checked to see that it is in the configured state. In the configured state a multi-byte security code is saved in the module 10. The memory module 10 must also have a good battery 30. The battery 30 is put under load and tested for proper operating voltage. The data is then checked in the memory module 10 for any errors. This is done by checking each data base block against its stored check sum, that was saved when that software block was configured. Each software block's checksum is recalculated and checked against its saved memory module 10 value. They must verify before the module is used by the instrument.

A blank or previously used module 10 can be reconfigured to what the instruments configuration is as long as the instrument is configured and the instrument battery (not shown) and memory module battery 30 are good. The data transfer is verified after the transfer is complete. The instrument's memory loading switch 38 must be moved from the 'normal' to the 'module load' position for this type of operation. See FIG. 2.

An on-line set of memory module tests was also added that would increase the memory modules degree of storing only good data. The on line tests consists of recalculating each software blocks checksum periodically. This is compared to the stored value. Every time a parameter is stored into the memory module 10, the associated software blocks checksum is recalculated and stored in the memory module 10. The memory module's battery 30 is also periodically checked under a stimulated load during on-line use.

Any failure of the memory module 10 to pass a particular test will cause the instrument to display the associated error code in its display. In addition, the instrument will not use the questionable data base.

What is claimed is:

1. A portable memory module for a programmable controller, comprising:
   a hinged case, including an integral foot portion for maintaining said case in an upright orientation when stored on a flat surface;
   a memory chip for storing a digital configuration or other operating data;
   a multiple conductor connector, releasably interconnecting said programmable controller and the memory chip for transferring said digital configuration or other data therebetween;
   a battery, internal to the case, for providing electrical power to the chip for maintaining the data contents thereof; and
   insulating means for recessing the connector within the hinged case for preventing static discharges in the vicinity of the connector conductors.

2. A portable memory module for storing the data base of a programmable instrument, comprising:
   an outer case constructed of an electrically insulating material, said outer case including integral means for supporting said case in an upright position on a flat plate;
   means, internal to said outer case, for storing data; and
   an electrical connector releasably interconnecting said programmable instrument and the data storing means, said electrical connector recessed within said outer case, for preventing static electrical discharges in the vicinity of the electrical connector.

3. A portable memory module for storing the data base of a programmable instrument, comprising:
   an outer case, including integral means for supporting said case in an upright position on a flat plate;
   means, internal to said outer case, for storing data;
   means for releasably interconnecting said programmable instrument and the data storing means;
   a battery containing lithium, said battery internal to said outer case and electrically connected to the data storing means, for providing the data storing means with electric power.

4. A portable memory module for storing the data base of a programmable instrument as recited in claim 3 further comprising a three-wire battery lead configuration interconnecting the battery and the data storing means, whereby the battery connection can be plugged into the memory module in more than one orientation.

5. A portable memory module for storing the data base of a programmable instrument as recited in claim 3 further comprising a dual battery connector to permit attachment of a second battery before removal of the battery providing electric power to the data storing means.

6. A portable memory module for storing the data base of a programmable instrument as recited in claim 3 further comprising means for periodically checking the battery under load conditions for proper operating voltage.

* * * * *